United States Patent
Basel

(10) Patent No.: US 6,341,166 B1
(45) Date of Patent: Jan. 22, 2002

(54) AUTOMATIC CORRECTION OF POWER SPECTRAL BALANCE IN AUDIO SOURCE MATERIAL

(75) Inventor: Peter L. Basel, Bolton, MA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 08/820,370

(22) Filed: Mar. 12, 1997

(51) Int. Cl.[7] .................................................. H03G 5/00
(52) U.S. Cl. ........................................ 381/103; 381/101
(58) Field of Search ............................. 381/98–103, 61, 381/63; 333/28 T, 28 R

(56) References Cited

U.S. PATENT DOCUMENTS

| | | | | |
|---|---|---|---|---|
| 4,841,506 A | * | 6/1989 | Kiyoura et al. | 369/32 |
| 5,434,923 A | * | 7/1995 | Honda | 381/98 |
| 5,450,312 A | * | 9/1995 | Lee et al. | 381/103 |
| 5,572,443 A | * | 11/1996 | Emoto et al. | 381/103 |

* cited by examiner

Primary Examiner—Ping Lee

(57) ABSTRACT

An audio system that automatically corrects for variations in spectral balance in audio source material. The audio system comprises a power spectrum analyzer and a source correction equalizer unit coupled to receive an audio input signal, and an index control unit coupled to a spectral balance correction data memory. A reference spectral balance may initially be established by playing a reference source medium with desired sound attributes. The power spectrum analyzer characterizes the spectral balance of the reference source medium, storing the results in non-volatile memory. When a particular source medium is played for the first time, the index control unit reads an identifying parameter from the particular source medium. Because there is no entry for the identifying parameter in spectral balance correction data memory, the particular source medium has not been previously played on the audio system. The particular source medium is then played in its entirety, with the index control unit signaling the power spectrum analyzer to characterize the spectral balance of the particular source medium. When the particular source medium is finished playing, an equalizer settings compute unit compares the reference spectral balance and the spectral balance for the particular source medium and calculates equalizer correction settings, which are then stored in spectral balance correction data memory. These settings can be used to adjust the spectral balance of the particular source medium to match that of the reference source medium. When the particular source medium is subsequently played, the identifying parameter may be used to recall these desired equalizer settings.

33 Claims, 6 Drawing Sheets

AUTOMATIC CORRECTION OF POWER SPECTRAL BALANCE IN AUDIO SOURCE MATERIAL

BACKGROUND OF THE INVENTION

1. Field of the Invention

This invention relates to the field of professional and consumer high-fidelity audio equipment, and more particularly to systems and methods for equalizing audio signals.

2. Description of the Related Art

The audible frequency spectrum (roughly 20 Hz to 20 KHz) can be arbitrarily divided into various ranges. Commonly, sound is classified as low frequency (bass), mid-range frequency, or high frequency (treble). Alternately, the spectrum can be divided into ten octaves (an interval between two frequencies having a two to one ratio), or thirty bands of one-third octave each. A spectral analysis of a signal provided from audio source material characterizes the power of the signal at various frequency ranges. The profile of signal power across these ranges is defined as its spectral balance.

It is well recognized in the audio field that source material, such as music on Compact Disc (CD), has a widely varying spectral balance. This can be explained, in part, by variations in the recording process.

Turning to FIG. 1, a simplified recording process 100 is shown. Within a recording studio 110, microphones typically receive sound waves from the performers and their instruments. The microphone signals are combined in a mixing console and the tracks are mixed down to two stereo channels. The sound is perfected by the production team by listening to the two-channel mix, which is processed by an equalizer and amplifier to drive the monitor speakers. A master mix 130 is made by recording the two-track signal taken before the studio room equalization, and may be further enhanced to correct any deficiencies in the recording process. Master mix 130 is then used to manufacture distribution media 140. Examples include CD 140A, Digital Versatile Disc (DVD) 140B, Laser Disc 140C, VHS 140D, and Cassette 140E. Production team 120 controls various factors throughout recording process 100.

One primary cause of widely varying spectral balance on audio source material is the lack of a standard for the equalization of studio loudspeakers. Other causes include the personal preferences of the production team and tailoring for improved sound quality on car radios and low-cost portable CD players (at the expense of high-end systems). Another unfortunate source is high-frequency hearing loss in members of the production team.

Currently, an end user of an audio system may compensate for variation in spectral balance by using widely available multiband equalizers. Different frequency ranges can be amplified or attenuated by the equalizer to achieve a desired spectral balance. The drawback, however, is that new equalizer settings may be required each time a different source medium is played in order to attain consistent spectral balance. This type of manual setup is not widely employed because it is both time-consuming and often inaccurate. It would therefore be desirable to automate and improve the process of correcting for frequency spectral variations across different audio source media.

SUMMARY OF THE INVENTION

The problems outlined above are in large part solved by an audio system in accordance with the present invention. In one embodiment, an audio system is provided that automatically corrects for variations in spectral balance in audio source material. The audio system comprises a power spectrum analyzer and a source correction equalizer unit coupled to receive an audio input signal. The audio system also comprises an index control unit coupled to a spectral balance correction data memory. A reference spectral balance may initially be established by playing a reference source medium with desired sound attributes. The power spectrum analyzer characterizes the spectral balance of the reference source medium, storing the results in non-volatile memory. When a particular source medium is played, the index control unit reads an identifying parameter from the particular source medium. The index control unit then searches the spectral balance correction data memory in order to determine if there is an existing entry for the identifying parameter (and hence, the particular source medium). If the particular source medium has not previously been played, there will be no existing entry. The particular source medium is then played in its entirety, with the index control unit signaling the power spectrum analyzer to characterize the spectral balance of the particular source medium. When the particular source medium is finished playing, an equalizer settings compute unit compares the reference spectral balance and the spectral balance for the particular source medium and calculates equalizer correction settings. These settings, which are also stored to spectral balance correction data memory, may be used to adjust the spectral balance of the particular source medium to match that of the reference source medium. When the particular source medium is subsequently played, the index control unit reads the identifying parameter from the medium, and finds the equalizer correction settings stored in the spectral balance correction data memory. These settings are applied to the source correction equalization unit, which attenuates or amplifies selected frequency ranges of the audio input signal, thereby producing an audio output signal. The audio output signal can also be equalized independently to adjust for listener preferences and room acoustics. In one embodiment, the audio system may also store a plurality of additional reference spectral balances which are user-selectable for various musical styles and listener preferences.

Broadly speaking, the present invention contemplates a method for equalizing an audio input signal provided from an audio source storage medium comprising reading a parameter from the audio source storage medium. The method also comprises using the parameter to index into a memory location which stores particular equalizer settings, and controlling an equalizer unit in accordance with these settings. The equalizer unit is configured to adjust the magnitude of selected frequency ranges of the audio input signal in accordance with the particular equalizer settings, thereby producing an audio output signal.

The present invention also contemplates an audio system configured to equalize an audio input signal provided from an audio source storage medium. The audio system comprises a processing unit coupled to receive the audio input signal, and further coupled to a memory which stores particular equalizer settings. The audio system also comprises an equalizer unit coupled to the processing unit, wherein the equalizer unit is configured to receive the audio input signal. The processing unit is configured to read a parameter from the audio source storage medium, and use this parameter to index into a specific location within the memory which stores the particular equalizer settings. The processing unit is further configured to control the equalizer unit in accordance with the particular equalizer settings, causing the equalizer unit to produce an audio output signal by adjusting the magnitude of selected frequency ranges of the audio input signal.

The present invention further contemplates an audio system configured to equalize an audio input signal provided from an audio source storage medium. The audio system comprises an index control unit configured to read a parameter from the audio source storage medium, and a spectral balance correction memory which stores particular equalizer settings coupled to the index control unit. The audio system further comprises a source correction equalization unit coupled to the spectral balance correction memory bank, wherein the source correction equalization unit is coupled to receive the audio input signal and the particular equalizer settings. The source correction equalization unit is further configured to adjust the magnitude of selected frequency ranges of the audio input signal in accordance with the particular equalizer settings, thereby establishing an audio output signal.

BRIEF DESCRIPTION OF THE DRAWINGS

Other objects and advantages of the invention will become apparent upon reading the following detailed description and upon reference to the accompanying drawings in which.

Figure 1:
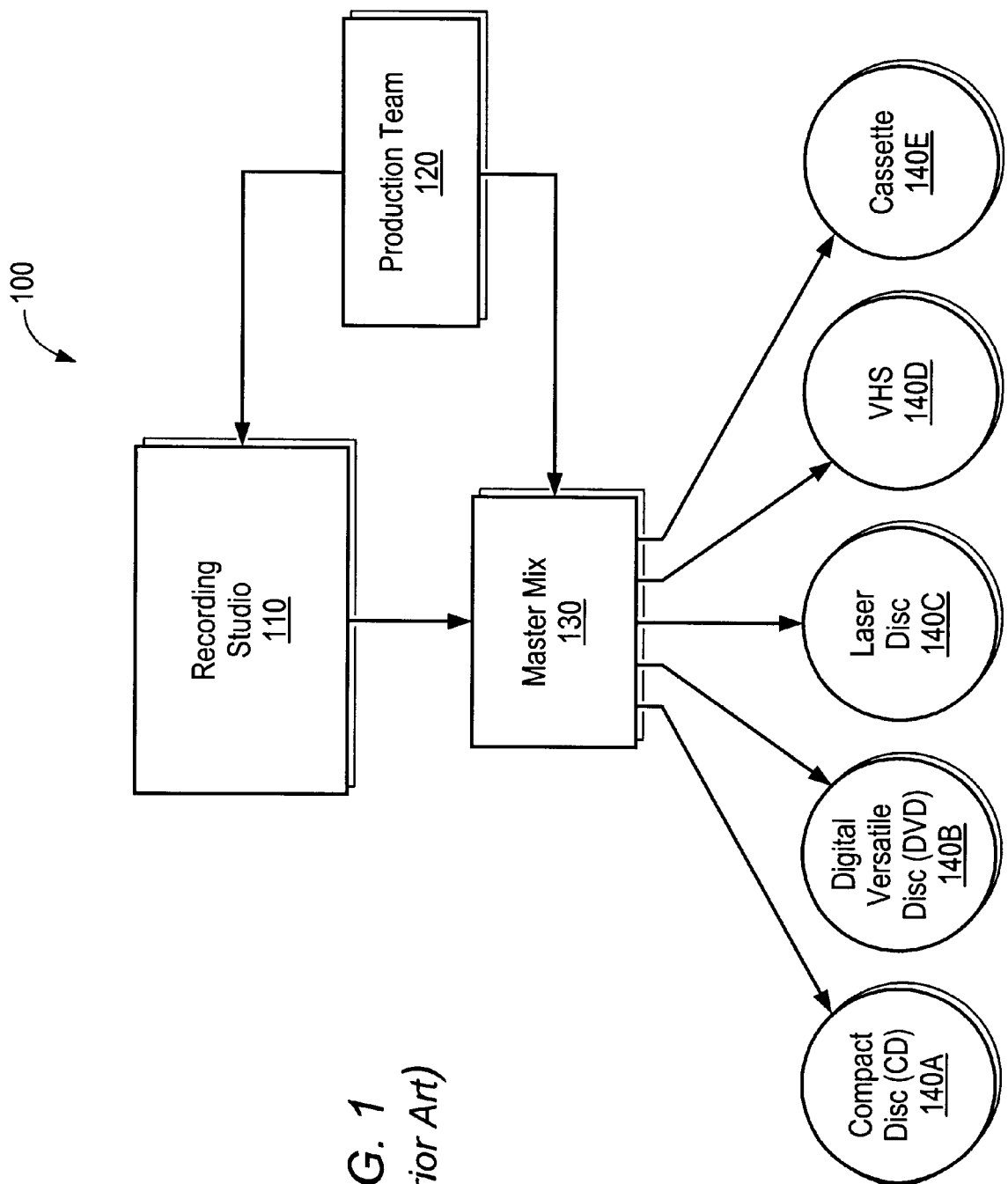
FIG. 1 is a block diagram of a simplified recording process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
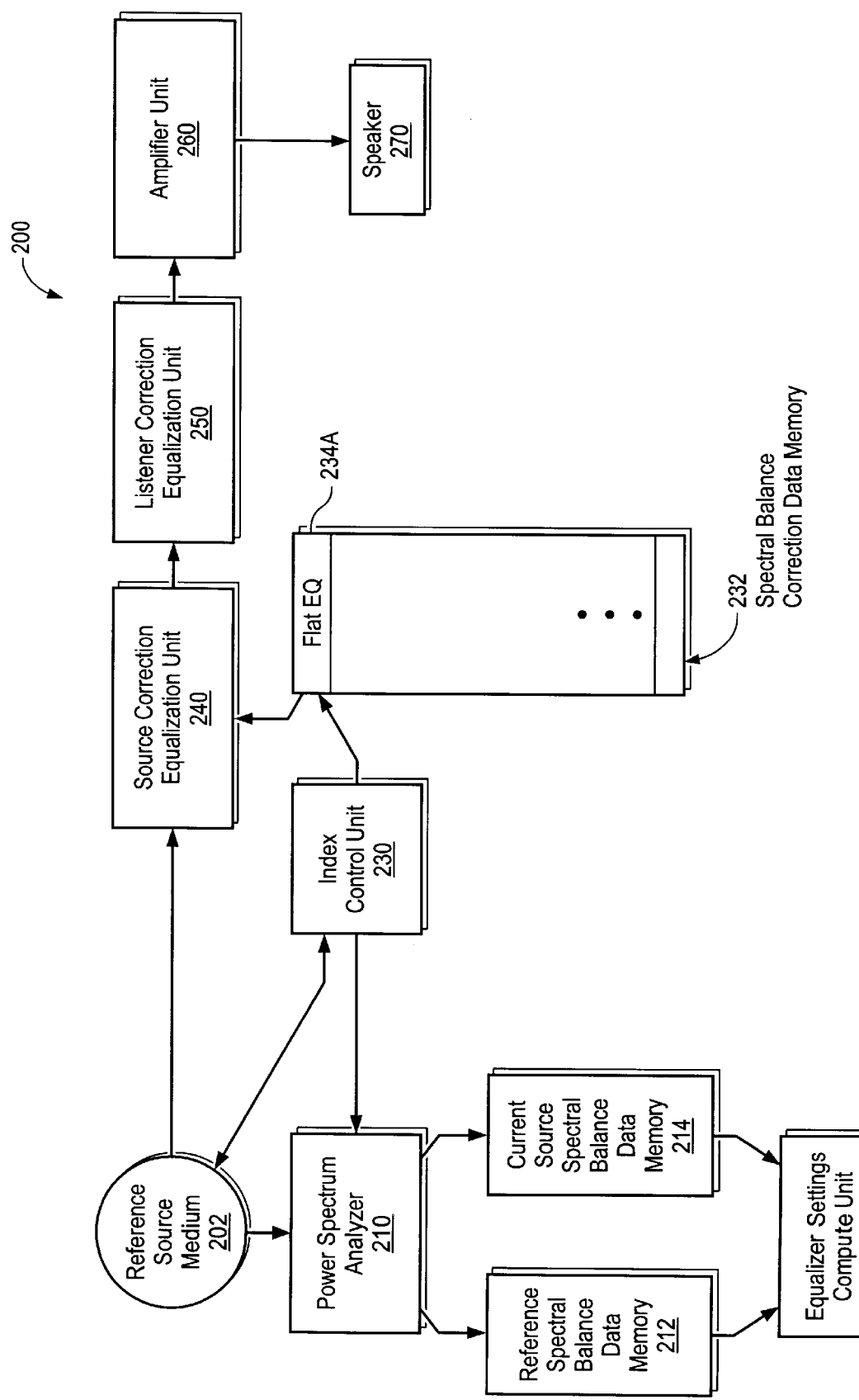
FIG. 2 is a functional block diagram of an audio system in accordance with one embodiment of the present invention.

Turning now to FIG. 2, a functional block diagram of an audio system is shown in accordance with one embodiment of the present invention. As depicted, audio system 200 includes a reference source medium 202 which provides an audio input signal to a power spectrum analyzer 210 and a source correction equalization unit 240. Power spectrum analyzer 210 is coupled to a reference spectral balance data memory 212 and a current source spectral balance data memory 214, which are both coupled to an equalizer settings compute unit 220. An index control unit 230 is coupled to power spectrum analyzer 210, reference source medium 202, and spectral balance correction data memory 232. Spectral balance correction data memory 232 is further coupled to source correction equalization unit 240, which provides an output signal to a listener correction equalization unit 250. Listener correction equalization unit 250 provides an output signal to a speaker 270 through an amplifier unit 260. As will described below, various components of this audio system may be used to automatically correct a wide variety of input spectral balances.

Generally speaking, audio system 200 may automatically correct for variations in audio source material spectral balance. This material may be one of a variety of distribution media, such as Compact Disc (CD), Digital Versatile Disc (DVD), Laser Disc, VHS, or cassette. As will be described in greater detail below, the spectral balance of reference source medium 202 is first characterized and stored in reference spectral balance data memory 212. Next, when a particular source medium is played for the first time, its spectral balance is computed and compared to the reference spectral balance. This information is used to calculate equalizer settings that can be applied to the audio signal provided by the particular source medium to adjust its spectral balance to match that of reference source medium 202. These equalizer settings are saved in spectral balance correction data memory 232 for recall when the particular source medium is replayed.

FIG. 2 illustrates a first step in a playback process. Reference source medium 202 is selected by a user to establish a reference spectral balance for all other recordings. Therefore, a reference source medium 202 that exhibits a desirable overall sound balance (in the opinion of the user) should be selected. In one embodiment, reference source medium 202 could be included with audio system 200 to assist an inexperienced user. Reference source medium 202 is then played in its entirety. This portion of operation, referred to as the establish reference mode, causes power spectrum analyzer 210 to characterize the spectral balance of reference source medium 202 and store the results in reference spectral balance data memory 212. In one embodiment, reference spectral balance data memory 212 is non-volatile (meaning it will retain data when power is removed from the system).

Because reference source medium 202 is considered to have a desired spectral balance, no equalization correction needs to be applied to source correction equalization unit 240. Reference source medium 202 is therefore played with a flat equalization correction setting (flat EQ). (A flat setting on a equalizer for a particular frequency range means no adjustment is applied. The equalizer setting for reference source medium 202 is flat for all frequency ranges). Index control unit 230 then associates reference source medium 202 with flat EQ setting 234A in spectral balance correction data memory 232. This is done by index control unit 230 reading an identifying parameter corresponding to an identification code from reference source medium 202. This identification code may indicate information such as the artist and title of reference source medium 202. The identification code is then stored in spectral balance correction data memory 232 with flat EQ setting 234A. When reference source medium 202 is subsequently played, its identification code will cause it to be associated with setting 234A. In one embodiment, spectral balance correction data memory 232 is also non-volatile.

Thus, in the establish reference mode, source correction equalization unit 240 receives the audio input signal from reference source medium 202 and passes it through to listener correction equalization unit 250 with no adjustment. Listener correction equalization unit 250 allows the user of audio system 200 to simultaneously listen to reference source medium 202 and adjust the equalization without affecting the data being stored in reference spectral balance data memory 212. Listener correction equalization unit 250 can be used to tailor the spectral balance to the listener's preference as well as to optimize the sound for a particular room. The output of listener correction equalization unit 250 is conveyed to speaker 270 through an amplifier unit 260.

Figure 3:
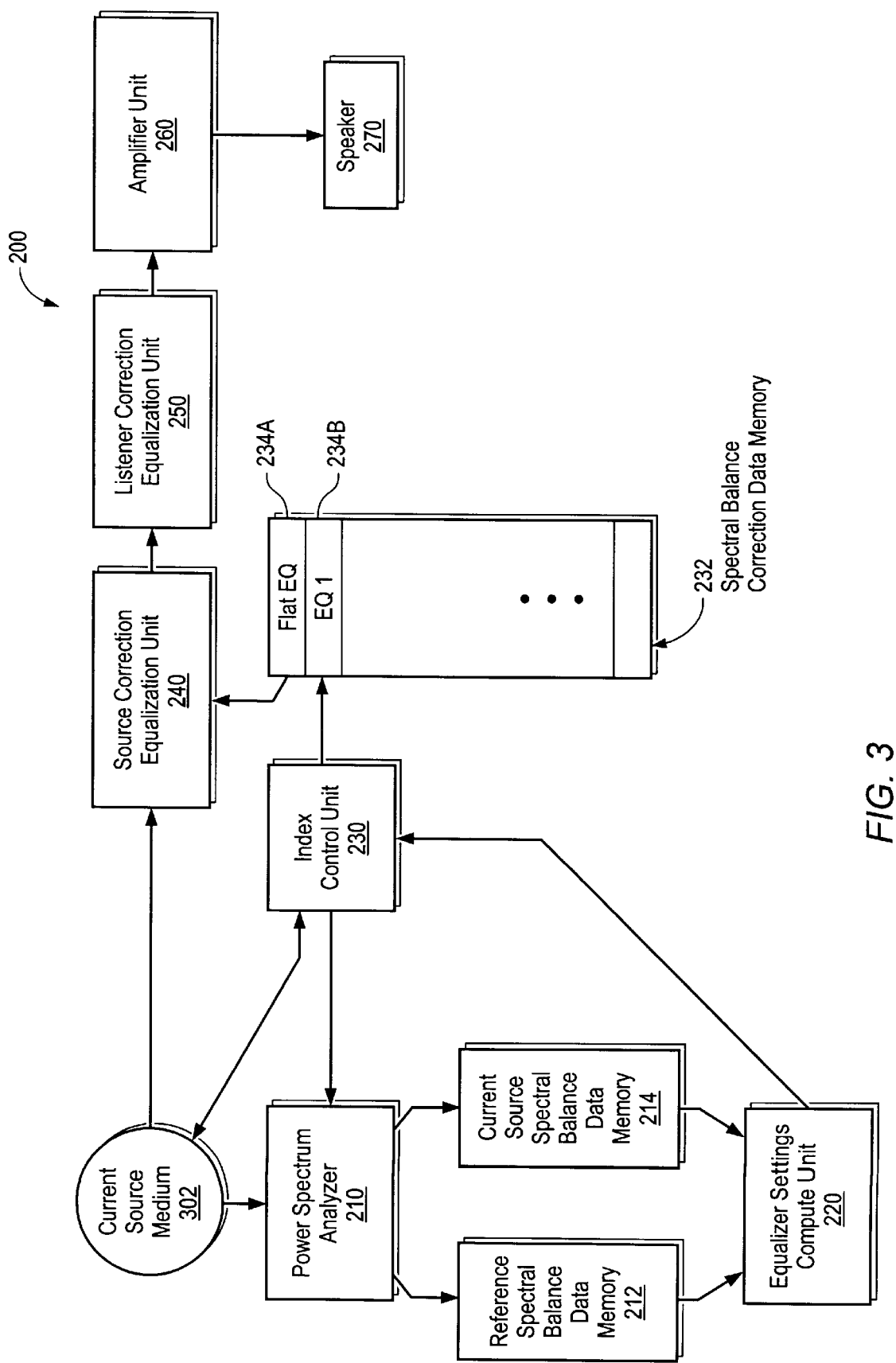
FIG. 3 is a functional block diagram of further aspects of an audio system in accordance with one embodiment of the present invention.

Turning now to FIG. 3, a functional block diagram of further aspects of audio system 200 is shown. Functional blocks corresponding to those of FIG. 2 are numbered identically for simplicity and clarity.

FIG. 3 illustrates the next step in the playback process. This step is executed the first time a new source medium is played (in FIG. 3, current source medium 302) following the effectuation of the establish reference mode, as described above. Index control unit 230 reads an identifying parameter from current source medium 302 in order to determine if it has previously been played on audio system 200. (If it has not been played, there will be no entry for the identifying parameter of current source medium 302 in spectral balance correction data memory 232). Current source medium 302 is then played in its entirety in order to obtain the data necessary to make spectral balance corrections. Current source medium 302 provides an audio input signal to power spectrum analyzer 210 and source correction equalization unit 240. Index control unit 230, upon detecting a new medium, signals power spectrum analyzer 210 to characterize the spectral balance of current source medium 302 and store the results in current source spectral balance data memory 214. When current source medium 302 has finished playing, equalizer settings compute unit 220 compares the newly-generated spectrum stored in current source spectral balance data memory 214 with the reference spectral balance stored in reference spectral balance data memory 212. Equalizer settings compute unit 220 then determines the required filter parameters necessary to adjust the spectral balance of current source medium 302 to match that of reference source medium 202. In one embodiment, this calculation can be done using homomorphic signal processing (HSP), a complex digital signal processing algorithm.

The equalizer settings determined by equalizer settings compute unit 220 are conveyed to spectral balance correction data memory 232 at a location specified by index control unit 230. Since current source medium 302 has not been previously played on audio system 200, a new location within spectral balance correction data memory 232 is established. In FIG. 3, this location is shown as EQ 1 (234B). As will be described below, the information in this location will be recalled the next time current source medium 302 is played.

Source correction equalization unit 240 receives the audio input signal from current source medium 302 and passes it through to listener correction equalization unit 250 with no adjustment. No adjustment is made because in this embodiment, the proper equalization correction settings are not determined until current source medium 302 is played in its entirety. The index control unit therefore applies flat equalization to source correction equalization unit 240. As described above, equalization adjustments can be made in listener correction equalization unit 250 that are conveyed to speaker 270 through amplifier unit 260.

It is noted that in other embodiments, a shorter sample of current source medium 302 may be used to initially calculate the correction settings. This would eliminate the need to play current source medium 302 in its entirety before applying a calculated equalization adjustment to correct spectral balance. As the current source medium 302 continues to play, periodic adjustments may be made based upon the longer samples.

Figure 4:
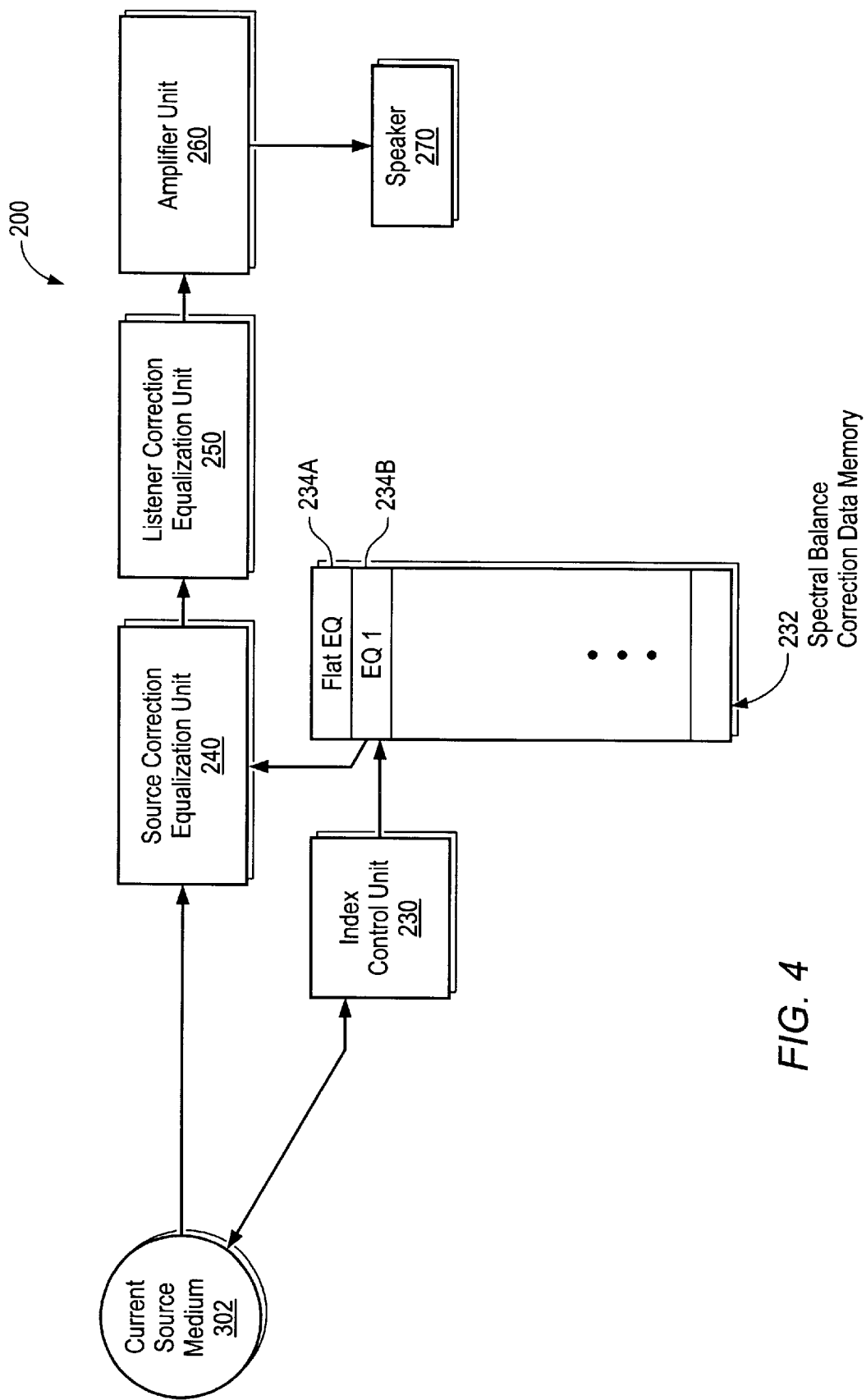
FIG. 4 is a functional block diagram which illustrates additional aspects of an audio system in accordance with one embodiment of the present invention.

Turning now to FIG. 4, a functional block diagram is shown which illustrates additional aspects of audio system 200. Blocks corresponding to those in FIGS. 2 and 3 are numbered identically.

FIG. 4 illustrates a final step in the playback process. This step is executed when playing a source medium that has already been processed as described with reference to FIG. 3. Index control unit 230 reads the identifying parameter from current source medium 302, and checks for an existing entry in spectral balance correction data memory 232. As described above, an EQ 1 setting at location 234B was previously assigned to current source medium 302. Index control unit therefore applies the equalizer settings in location 234B to source correction equalization unit 240. This adjusts the spectral balance of the output signal conveyed to listener correction equalization unit 250 to match that of reference source medium 202. As described above, equalization adjustments can be made in listener correction equalization unit 250 that are conveyed to speaker 270 through amplifier unit 260.

Figure 5:
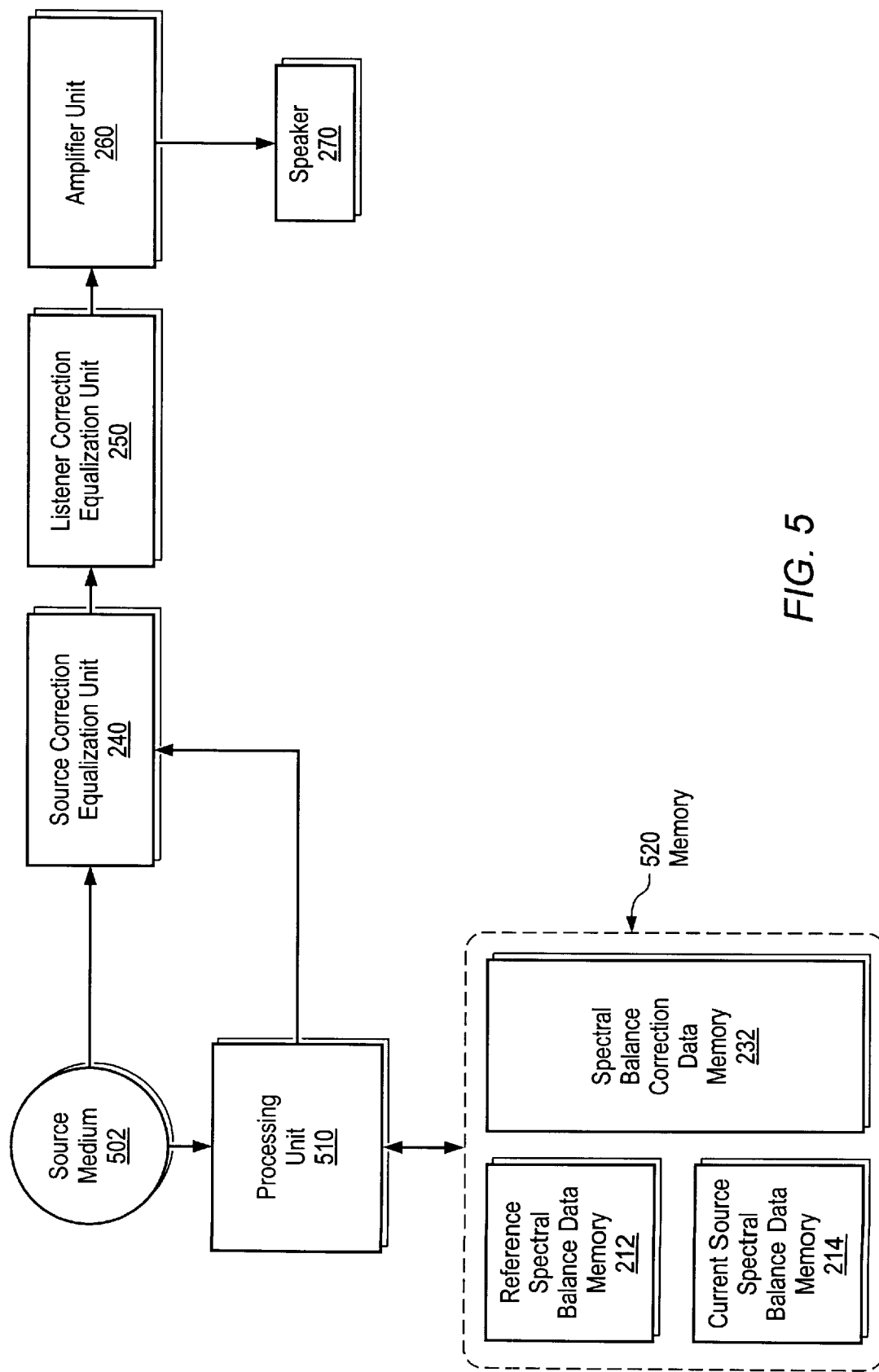
FIG. 5 is a hardware block diagram of an implementation of an audio system in accordance with one embodiment of the present invention.

Turning now to FIG. 5, a hardware block diagram of an implementation of audio system 200 is shown. Blocks corresponding to those in FIGS. 2–4 are numbered identically. As depicted, audio system 200 includes a processing unit 510 coupled to receive an audio input signal from source medium 502, and further coupled to source correction equalization unit 240. Processing unit 510 is further coupled to a memory 520 which includes reference spectral balance reference data 212, current source spectral balance data memory 214, and spectral balance correction data memory 232.

FIG. 5 shows how the various logical blocks in FIGS. 2–4 can be implemented in hardware under software control. Processing unit 510, in conjunction with suitable software stored in memory, implements the functions of power spectrum analyzer 210, equalizer settings compute unit 220, and index control unit 230. In one embodiment, processing unit 510 must have DSP capability in order to perform spectral analysis and the homomorphic signal processing algorithms required to calculate EQ settings. Memory 520, which is coupled to processing unit 510, includes both non-volatile and volatile storage in one embodiment. Processing unit 510 uses memory 520 to store spectral balance data, EQ settings corresponding to various source media, and also any software routines executable by processing unit 510.

Processing unit 510 applies EQ settings to source correction equalization unit 240, which conveys an output signal to listener correction equalization unit 250. In each of these equalization units, the actual equalization might be preformed by digital signal processing techniques under the control of unit 510 or a similar processing unit.

Figure 6:
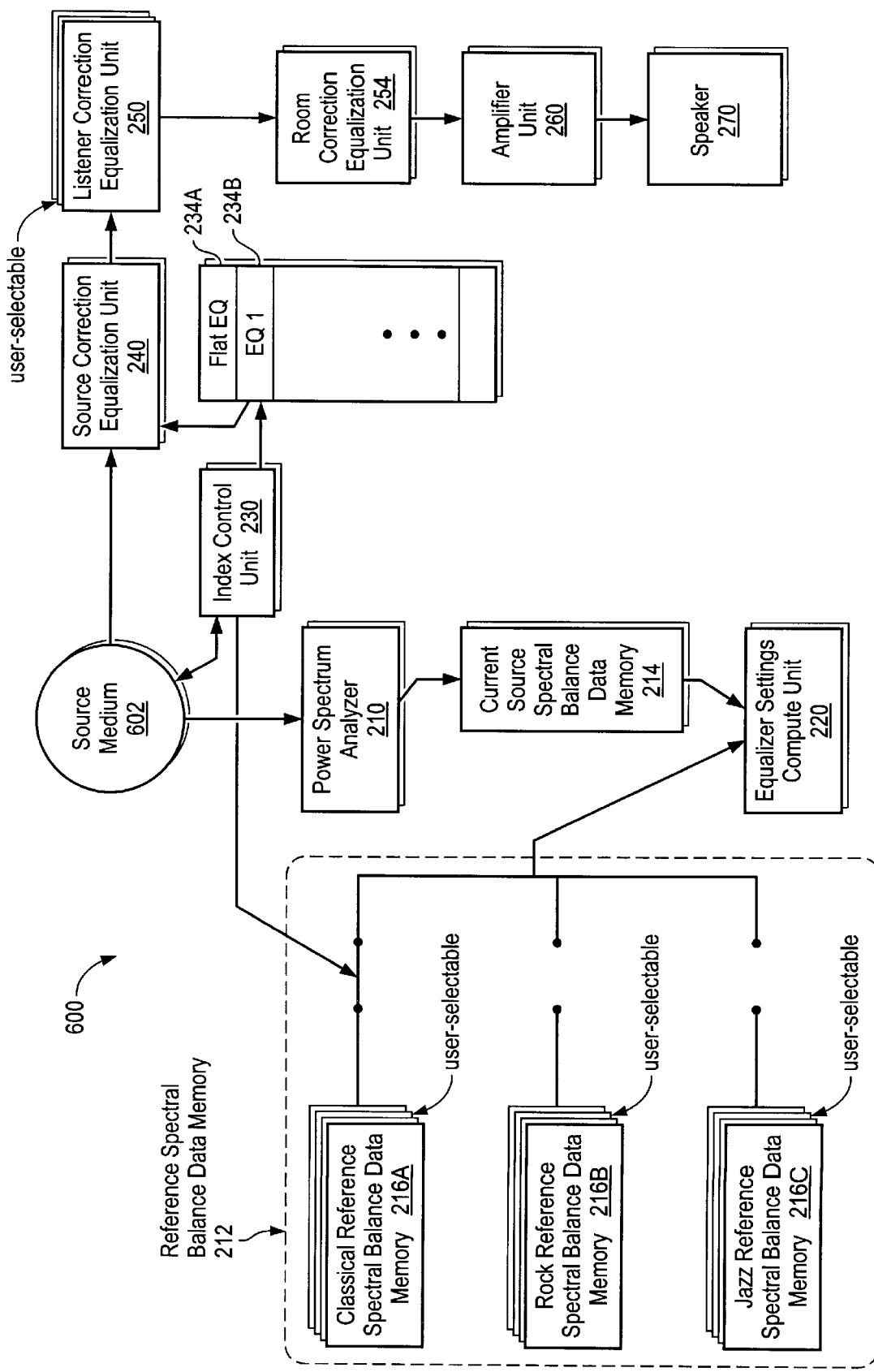
FIG. 6 is a functional block diagram of an audio system in accordance with one embodiment of the present invention.

Turning now to FIG. 6, a functional block diagram is shown in accordance with another embodiment of an audio system. Blocks corresponding to those FIGS. 2–5 are numbered identically. Audio system 600 is similar to the audio system of FIGS. 2–5; however, audio system 600 includes a reference spectral balance data memory 212 having a plurality of stored reference spectral balances. Audio system 600 further includes a plurality of listener correction equalization units 250 and a room correction equalization unit 254.

In one embodiment, a parameter embedded on source medium 602 identifies a particular musical style. Index control unit 230 uses this parameter to index into one of spectral balance data memories 216A–C. For each musical style, a user can store a plurality of spectral balances. The combination of the index selection and the user selection determines which memory location is used to send information to equalize settings compute unit 220 to calculate equalizer settings for a new source medium.

Additionally, audio system 600 includes a plurality of listener correction equalization units 250. Each of these can store preferences for a plurality of listeners. Therefore, the spectral balance adjustments applied to source correction equalization unit 240 can be further adjusted depending on the preference of the particular listener. Furthermore, the output of this unit is conveyed to a room correction equalization unit 254, where the spectral balance may be tailored to room acoustics.

It is noted that other embodiments of an audio system are also possible. In one embodiment, a reference spectral balance could be loaded into a reference spectral balance memory (shown as 212 in FIGS. 2–6) during manufacture of an audio system, thus eliminating the need for an establish reference mode step as described with reference to FIG. 2. All source material played on the audio system would then be adjusted to match this preloaded spectral balance. Individual tailoring of the spectral balance of source material would then depend upon adjustments made in the listener correction equalization unit.

In yet another embodiment, information about the equalizer correction settings could be embedded on source material played on an audio system. This embedded information could be used to index into a plurality of preloaded equalization correction settings. This would eliminate the need to dynamically determine these settings as described with reference to FIGS. 2–3.

Additionally, other embodiments of the identifying parameter embedded on source material are also possible. In one embodiment, the start and end times of the various program selections could be used as the identifying parameter. While such a parameter is not guaranteed to be unique across all source material, it is unlikely to be duplicated within a particular user's collection. In another embodiment, a check sum value on the source medium could also be used as the identifying parameter, either alone or in combination with the program start and end times.

Numerous variations and modifications will become apparent to those skilled in the art once the above disclosure is fully appreciated. It is intended that the following claims be interpreted to embrace all such variations and modifications.

What is claimed is:

1. A method for equalizing an audio input signal provided from an audio source storage medium, comprising:
  characterizing a spectral balance corresponding to a reference audio source storage medium, thereby establishing a reference spectral balance;
  storing said reference spectral balance to a reference memory location;
  characterizing a spectral balance corresponding to said audio source storage medium, thereby establishing a current source spectral balance;
  reading a parameter from said audio source storage medium;
  using said parameter to index into a given memory location which stores particular equalizer settings;
  controlling an equalizer unit in accordance with said particular equalizer settings, wherein said equalizer unit is configured to adjust the magnitude of selected frequency ranges of said audio input signal in accordance with said particular equalizer settings, thereby producing an audio output signal; and
  calculating said particular equalizer settings in response to comparing a particular one of a plurality of reference spectral balances and said current source spectral balance, wherein said particular one of said plurality of reference spectral balances is user-selectable, and wherein said plurality of reference spectral balances is established by characterizing a plurality of spectral balances each corresponding to one of a plurality of reference audio source storage media, and wherein said plurality of reference spectral balances are stored in a plurality of reference memory locations, and wherein said plurality of reference memory locations are non-volatile.

2. The method for equalizing an audio input signal provided from an audio source storage medium as recited in claim 1, wherein said audio output signal exhibits a desired spectral balance.

3. The method for equalizing an audio input signal provided from an audio source storage medium as recited in claim 1, wherein said parameter identifies said audio source storage medium.

4. The method for equalizing an audio input signal provided from an audio source storage medium as recited in claim 1, wherein said calculating said particular equalizer settings is performed by homomorphic signal processing.

5. The method for equalizing an audio input signal provided from an audio source storage medium as recited in claim 1, further comprising storing said particular equalizer settings to said given memory location.

6. The method for equalizing an audio input signal provided from an audio source storage medium as recited in claim 5, wherein said given memory location is non-volatile.

7. The method for equalizing an audio input signal provided from an audio source storage medium as recited in claim 5, wherein said storing said particular equalizer settings to said given memory location is performed prior to said reading said parameter from said audio source storage medium.

8. The method for equalizing an audio input signal provided from an audio source storage medium as recited in claim 1, further comprising conveying said audio output signal to a second equalizer unit.

9. The method for equalizing an audio input signal provided from an audio source storage medium as recited in claim 8, further comprising controlling said second equalizer unit in accordance with user-defined settings, wherein said second equalizer unit is configured to attenuate selected frequency ranges of said audio output signal in accordance with said user-defined settings.

10. The method for equalizing an audio input signal provided from an audio source storage medium as recited in claim 8, further comprising controlling said second equalizer unit in accordance with a particular one of a plurality of user-defined settings, wherein said particular one of said plurality of user-defined settings is user-selectable, and wherein said second equalizer unit is configured to attenuate selected frequency ranges of said audio output signal in accordance with said particular one of said plurality of user-defined settings.

11. An audio system configured to equalize an audio input signal provided from an audio source storage medium, comprising:

a processing unit coupled to receive said audio input signal;

a memory coupled to said processing unit, wherein said memory includes a given memory location which stores particular equalizer settings; and an equalizer unit coupled to said processing unit, wherein said equalizer unit is configured to receive said audio input signal;

wherein said processing unit is configured to read a parameter which identifies said audio source storage medium from said audio source storage medium, and wherein said processing unit is configured to use said parameter to index into said given memory location and wherein said processing unit is further configured to control said equalizer unit in accordance with said particular equalizer settings, wherein said equalizer unit is configured to adjust the magnitude of selected frequency ranges of said audio input signal, thereby producing an audio output signal;

wherein said processing unit is further configured to characterize a spectral balance corresponding to a reference audio source storage medium, thereby establishing a reference spectral balance;

wherein said processing unit is further configured to store said reference spectral balance to a reference memory location;

wherein said processing unit is further configured to characterize a spectral balance corresponding to said audio source storage medium, thereby establishing a current source spectral balance; and wherein said processing unit is further configured to calculate said particular equalizer settings in response to comparing a particular one of a plurality of reference spectral balances and said current source spectral balance, wherein said particular one of said plurality of reference spectral balances is user-selectable, and wherein said plurality of reference spectral balances is established by characterizing a plurality of spectral balances each corresponding to one of a plurality of reference audio source storage media, and wherein said plurality of reference spectral balances are stored in a plurality of reference memory locations, and wherein said plurality of reference memory locations are non-volatile.

12. An audio system configured to equalize an audio input signal provided from an audio source storage medium as recited in claim 11, wherein said audio output signal exhibits a desired spectral balance.

13. An audio system configured to equalize an audio input signal provided from an audio source storage medium as recited in claim 11, wherein said processing unit calculates said particular equalizer settings by homomorphic signal processing.

14. An audio system configured to equalize an audio input signal provided from an audio source storage medium as recited in claim 11, wherein said processing unit is further configured to store said particular equalizer settings to said given memory location.

15. An audio system configured to equalize an audio input signal provided from an audio source storage medium as recited in claim 14, wherein said given memory location is non-volatile.

16. An audio system configured to equalize an audio input signal provided from an audio source storage medium as recited in claim 14, wherein said processing unit storing said particular equalizer settings to said given memory location is performed prior to said processing unit reading said parameter from said audio source storage medium.

17. An audio system configured to equalize an audio input signal provided from an audio source storage medium as recited in claim 11, further comprising a second equalizer unit coupled to receive said audio output signal as an input.

18. An audio system configured to equalize an audio input signal provided from an audio source storage medium as recited in claim 17, wherein said processing unit is further configured to control said second equalizer unit in accordance with user-defined settings, and wherein said second equalizer unit is configured to attenuate selected frequency ranges of said audio output signal in accordance with said user-defined settings.

19. An audio system configured to equalize an audio input signal provided from an audio source storage medium as recited in claim 17, wherein said processing unit is further configured to control said second equalizer unit in accordance with a particular one of a plurality of user-defined settings, wherein said particular one of said plurality of user-defined settings is user-selectable, and wherein said second equalizer unit is configured to attenuate selected frequency ranges of said audio output signal in accordance with said particular one of said plurality of user-defined settings.

20. An audio system configured to equalize an audio input signal provided from an audio source storage medium, comprising:

an index control unit configured to read a parameter which identifies said audio source storage medium from said audio source storage medium;

a spectral balance correction memory coupled to said index control unit, wherein said spectral balance correction memory stores particular equalizer settings;

a source correction equalization unit coupled to said spectral balance correction memory, wherein said source correction equalization unit is coupled to receive said audio input signal and said particular equalizer settings, and wherein said source correction equalization unit is further configured to adjust the magnitude of selected frequency ranges of said audio input signal, thereby establishing an audio output signal;

a power spectrum analyzer, wherein said power spectrum analyzer is configured to characterize a spectral balance corresponding to a reference audio source storage medium, thereby establishing a reference spectral balance;

a reference spectral balance memory, wherein said power spectrum analyzer is further configured to store said reference spectral balance to said reference spectral balance memory;

a current source spectral balance memory, wherein said power spectrum analyzer is further configured to characterize a spectral balance corresponding to said audio source storage medium, thereby establishing a current source spectral balance, and wherein said power spectrum analyzer is configured to store said current source spectral balance to said current source spectral balance memory; and an equalizer setting compute unit configured to calculate said particular equalizer settings in response to comparing a particular one of a plurality of reference spectral balances and said current source spectral balance, wherein said particular one of said plurality of reference spectral balances is user-selectable, and wherein said plurality of reference spectral balances is established by characterizing a plurality of spectral balances each corresponding to one of a plurality of reference audio source storage media, and wherein said plurality of reference spectral balances are stored in a plurality of reference memory locations, and wherein said plurality of reference memory locations are non-volatile.

21. An audio system configured to equalize an audio input signal provided from an audio source storage medium as recited in claim 20, wherein said audio output signal exhibits a desired spectral balance.

22. An audio system configured to equalize an audio input signal provided from an audio source storage medium as recited in claim 20, wherein said equalizer setting compute unit calculates said particular equalizer settings by homomorphic signal processing.

23. An audio system configured to equalize an audio input signal provided from an audio source storage medium as recited in claim 20, wherein said equalizer setting compute unit is further configured to store said particular equalizer settings to said spectral balance correction memory.

24. An audio system configured to equalize an audio input signal provided from an audio source storage medium as recited in claim 23, wherein said equalizer setting compute unit storing said particular equalizer settings to said spectral balance correction memory is performed prior to said index control unit reading said parameter from said audio source storage medium.

25. An audio system configured to equalize an audio input signal provided from an audio source storage medium as recited in claim 20, further comprising a listener correction equalization unit coupled to receive said audio output signal as an input.

26. An audio system configured to equalize an audio input signal provided from an audio source storage medium as recited in claim 25, wherein said listener correction equalization unit attenuates selected frequency ranges of said audio output signal in accordance with user-defined settings.

27. An audio system configured to equalize an audio input signal provided from an audio source storage medium as recited in claim 25, wherein said processing unit is further configured to control said listener correction equalization unit in accordance with a particular one of a plurality of user-defined settings, wherein said particular one of said plurality of user-defined settings is user-selectable, and wherein said listener correction equalization unit is configured to attenuate selected frequency ranges of said audio output signal in accordance with said particular one of said plurality of user-defined settings.

28. A method for equalizing an audio input signal provided from an audio source storage medium, comprising:

characterizing a spectral balance corresponding to a reference audio source storage medium, thereby establishing a reference spectral balance, wherein said reference spectral balance is user-selectable;

storing said reference spectral balance within a reference non-volatile memory location;

characterizing a spectral balance corresponding to said audio input signal, thereby establishing a current source spectral balance;

calculating a particular equalizer setting in response to comparing said reference spectral balance and said current source spectral balance;

storing said particular equalizer setting into a given memory location;

reading a parameter from said audio source storage medium;

using said parameter to index into said given memory location which stores said particular equalizer setting; and controlling an equalizer unit in accordance with said particular equalizer setting, wherein said equalizer unit is configured to adjust the magnitude of selected frequency ranges of said audio input signal in accordance with said particular equalizer settings, thereby producing an audio output signal.

29. The method for equalizing an audio input signal provided from an audio source storage medium as recited in claim 28, wherein said calculating said particular equalizer setting is performed by homomorphic signal processing.

30. The method for equalizing an audio input signal provided from an audio source storage medium as recited in claim 28, wherein said given memory location is non-volatile.

31. An audio system configured to equalize an audio input signal provided from an audio storage medium, comprising:

a processing unit coupled to receive said audio input signal;

a memory coupled to said processing unit, wherein said memory includes a given memory location which stores a particular equalizer setting; and an equalizer unit coupled to said processing unit, wherein said equalizer unit is configured to receive said audio input signal;

wherein said processing unit is configured to read a parameter from said audio source storage medium and to use said parameter to index into said given memory location, and wherein said processing unit is further configured to control said equalizer unit in accordance with said particular equalizer setting to thereby adjust the magnitude of selected frequency ranges of said audio input signal to produce an audio output signal;

wherein said processing unit is further configured to characterize a spectral balance corresponding to a reference audio source storage medium, thereby establishing a reference spectral balance, wherein said reference spectral balance is user-selectable;

wherein said processing unit is further configured to store said reference spectral balance to a reference memory location;

wherein said processing unit is further configured to characterize a spectral balance corresponding to said audio input signal, thereby establishing a current source spectral balance; and wherein said processing unit is further configured to calculate said particular equalizer setting by comparing said reference spectral balance and said current source spectral balance, and to store said particular equalizer setting within said given memory location.

32. An audio system configured to equalize an audio input signal provided from an audio source storage medium as recited in claim 31, wherein said processing unit calculates said particular equalizer setting by homomorphic signal processing.

33. An audio system configured to equalize an audio input signal provided from an audio source storage medium as recited in claim 31, wherein said given memory location is non-volatile.

* * * * *